United States Patent
Thierry

(12) 
(10) Patent No.: US 6,300,146 B1
(45) Date of Patent: Oct. 9, 2001

(54) HYBRID PACKAGE INCLUDING A POWER MOSFET DIE AND A CONTROL AND PROTECTION CIRCUIT DIE WITH A SMALLER SENSE MOSFET

(75) Inventor: Vincent Thierry, Aix en Provence (FR)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/549,280

(22) Filed: Apr. 14, 2000

Related U.S. Application Data

(62) Division of application No. 09/344,704, filed on Jun. 25, 1999, now Pat. No. 6,137,165.

(51) Int. Cl.[7] .............................. G01R 31/26; H01L 21/66
(52) U.S. Cl. ............................... 438/14; 438/15; 438/17; 438/18; 438/5; 438/3
(58) Field of Search .................................. 438/14, 15, 17, 438/18, 5, 13

(56) References Cited

U.S. PATENT DOCUMENTS

| | | | |
|---|---|---|---|
| 5,851,846 | * 12/1998 | Matsui et al. | 478/17 |
| 5,886,397 | * 3/1999 | Ewer | 257/667 |
| 6,078,098 | * 6/2000 | Ewer | 257/667 |
| 6,184,585 | * 2/2001 | Martinez et al. | 257/777 |
| 6,204,554 | * 3/2001 | Ewer | 257/705 |

* cited by examiner

Primary Examiner—Caridad Everhart
Assistant Examiner—V. Yevsikov
(74) Attorney, Agent, or Firm—Ostrolenk, Faber, Gerb & Soffen, LLP

(57) ABSTRACT

A power MOSFET die and a logic and protection circuit die are mounted on a common lead frame pad, such as a TO220 lead frame pad. The logic and protection circuit die includes a MOSFET that is connected in parallel with the power MOSFET but which is smaller than the power MOSFET and which dissipates power at a predetermined fraction of that of the power MOSFET. The logic and protection circuit die also includes a temperature sensor that is in close proximity to the MOSFET and determines the temperature of the MOSFET. The die also includes another temperature sensor that is located distant from the MOSFET to determine the temperature of the lead frame. The temperature of the power MOSFET can be determined from the temperature measured by these two sensors and from the ratio of the power dissipated by the two MOSFETs.

9 Claims, 3 Drawing Sheets

HYBRID PACKAGE INCLUDING A POWER MOSFET DIE AND A CONTROL AND PROTECTION CIRCUIT DIE WITH A SMALLER SENSE MOSFET

This is a division of application Ser. No. 09/344,704, filed Jun. 25, 1999 now U.S. Pat. No. 6,137,791.

BACKGROUND OF THE INVENTION

The present invention relates to semiconductor devices and, more specifically relates to a semiconductor device in which an integrated temperature sensing and control die is mounted in the same housing as a MOS gated power semiconductor device.

The determination of the temperature of a MOS gate controlled semiconductor device, under transient as well as under steady state conditions, is highly desirable to attain high levels of operational reliability of the device. As an example, the device may be shut down at a predetermined die temperature. Also, overcurrent protection can be attained as a function of the die temperature and time.

Though control and protection circuits may be integrated into the same monolithic chip as the power device to enable direct temperature measurement of the power device, such monolithic devices are complex and complicate the manufacturing process of the discrete simpler power devices. Furthermore, there is less flexibility in the choice of control functions that can be integrated with the power device.

It is therefore desirable to co-package a discrete power semiconductor device with a separate die that includes the control and protection functions. By separating the control and protection functions from the power device, however, the temperature sensing circuitry is mounted at a distance away from the power device or is mounted with the power device on a common substrate that has a relatively high thermal resistance. This separation or thermal resistance prevents the temperature sensing circuitry from readily determining the temperature of the power device junctions. Moreover, the separation and thermal resistance hinder the determination of temperature under transient conditions.

It is therefore desirable that temperature sensing elements in the control die have the capability of accurately and dynamically determining the temperature of the power device.

SUMMARY OF THE INVENTION

The present invention provides a power semiconductor device that is co-packaged with a control and temperature sensing (or logic) die which is integrated into a small power die which is smaller than the main power die but which has a thermal response that is the same or similar to that of the power device. The smaller power device heats the logic elements by an amount proportional to the heating of the main power device. Temperature sensors are included in the smaller die to measure the temperature of the smaller device as well as that of the substrate which carries both the main and smaller die, providing signals to the logic circuits in the smaller die.

In carrying out the invention, the semiconductor devices may be copacked in a common device package that is comprised of a conductive lead frame which has a main pad area and has pins that are separated from each other. The main pad area is electrically coupled to at least one of the pins. A molded housing encapsulates the lead frame, and the pins extend beyond an external boundary of the molded housing and are available for external connection. First and second semiconductor die have opposing surfaces which contain respective electrodes are mounted on the main pad. The first semiconductor die consists of a first semiconductor device such as a standard discrete power MOSFET or other MOS gated power device. The second semiconductor die comprises a second semiconductor device which also may be a power MOSFET or other MOS gated power device which has temperature sensors and logic circuits integrated therein and is much smaller than the first device. A first thermal sensor is arranged on the second die adjacent to the second semiconductor device, and a second thermal sensor is arranged on the second die distant from the second semiconductor device. One of the opposing surfaces of each of the first and second semiconductor die are disposed atop and are in thermal contact with the main pad area. At least the first die is also in electrical contract with the main pad area. The first and second die are laterally spaced from each other. The opposite surfaces of the first and second die are electrically connected to respective pins as well as to each other such that the semiconductor devices are connected in parallel.

In accordance with this embodiment, the smaller MOSFET serves as a temperature sensing MOSFET and is connected in parallel to the main power MOSFET. A first thermal sensor is arranged either within or in close proximity to the sensing MOSFET to determine the temperature of the sensing MOSFET. A second temperature sensor is arranged on the control and temperature sensing die at a remote position with respect to the temperature sensing MOSFET cells so that the temperature of the lead frame can be measured. The ratio of the power dissipated by the temperature sensing MOSFET to that of the power MOSFET is known, and from this ratio and the measured temperatures, the temperature of the power MOSFET is determined.

The temperature sensors may be comprised of multiple identical sensor elements, such as series-connected polysilicon diodes, to simplify the determination of the measured value.

In accordance with another aspect of the invention, the temperature of the first semiconductor device of the package is determined from the temperature values measured by the first and second thermal sensors.

The novel invention is a form of a new "thermal mirror" circuit which is copacked with a standard discrete power MOSFET chip.

Thus, a logic chip, which can be made with a 10 mask process controls a 4 mask discrete chip which may be of the type shown in U.S. Pat. No. 5,795,793. The problem solved arises because the logic chip and discrete FET have a different $R_{DSON} \times area$ (for example, 200 m$\Omega$mm$^2$ for the logic chip and 100 m$\Omega$mm$^2$ for the discrete FET). A basic concept of the invention is to produce an output signal related to the main FET temperature ($T_{FET}$) of the following form:

$$T_{FET} \approx (K+0.2)(T_{SENSE}-T_{TAB})+T_{TAB}$$

where
- K=a technology factor (the ratio of $R_{DSON} \times area$ of the 2 different technologies). The added 0.2 factor adjusts for lateral temperature differences in the logic die. In the example given K is 2.0.
- $T_{SENSE}$=temperature produced by a small MOSFET in the logic die, generating the logic die temperature.

$T_{TAB}$=the temperature of the common support of the two die.

Once $T_{FET}$ reaches 150° C. (or some other predetermined temperature), the FET is turned off.

Other features and advantages of the invention will become apparent from the following description of the invention which refers to the accompanying drawings.

BRIEF DESCRIPTION OF THE DRAWINGS

The invention will now be described in greater detail in the following detailed description with references to the drawings in which.

DETAILED DESCRIPTION OF THE INVENTION

The present invention provides for a novel semiconductor device and hybrid device package in which a power MOSFET die is co-packaged with a control and protection circuit die that includes a smaller, temperature sensing MOSFET. The device package is typically TO220 device package, though any other device packages can be used.

Figure 1:
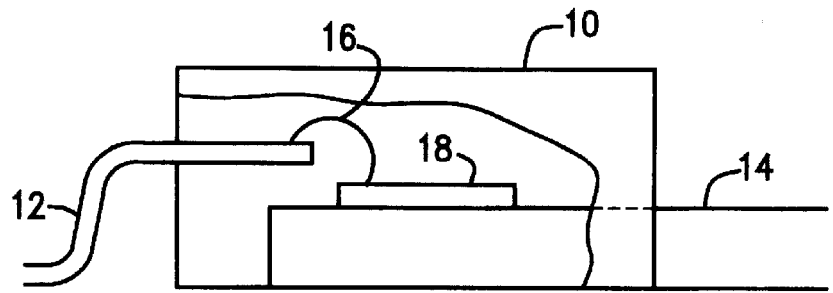
FIG. 1 is a schematic sectional view of a conventional TO220 device package in which the main and logic die of the invention may be mounted.

Referring first to FIG. 1, there is shown a conventional surface mounted TO220 package 10 illustrated in a schematic cutaway side view. A bottom surface of a semiconductor die 18, such as a MOS gated power semiconductor device, is soldered, glued or otherwise attached to a metal lead frame pad 14 of the package. The pad 14 provides thermal contact with the device 18 and may provide an electrical connection to the device. An upper terminal, for example, a source electrode, of the device 18 is connected to one or more of the lead frame terminals 12 by wire bond 16. Another of the lead frame terminals such as the gate terminal (not seen in FIG. 1) is connected by another wire bond (not shown). The device 18 and a portion of the lead terminals 12 and plate 14 are encapsulated in a package body, typically formed of resin.

Figure 2:
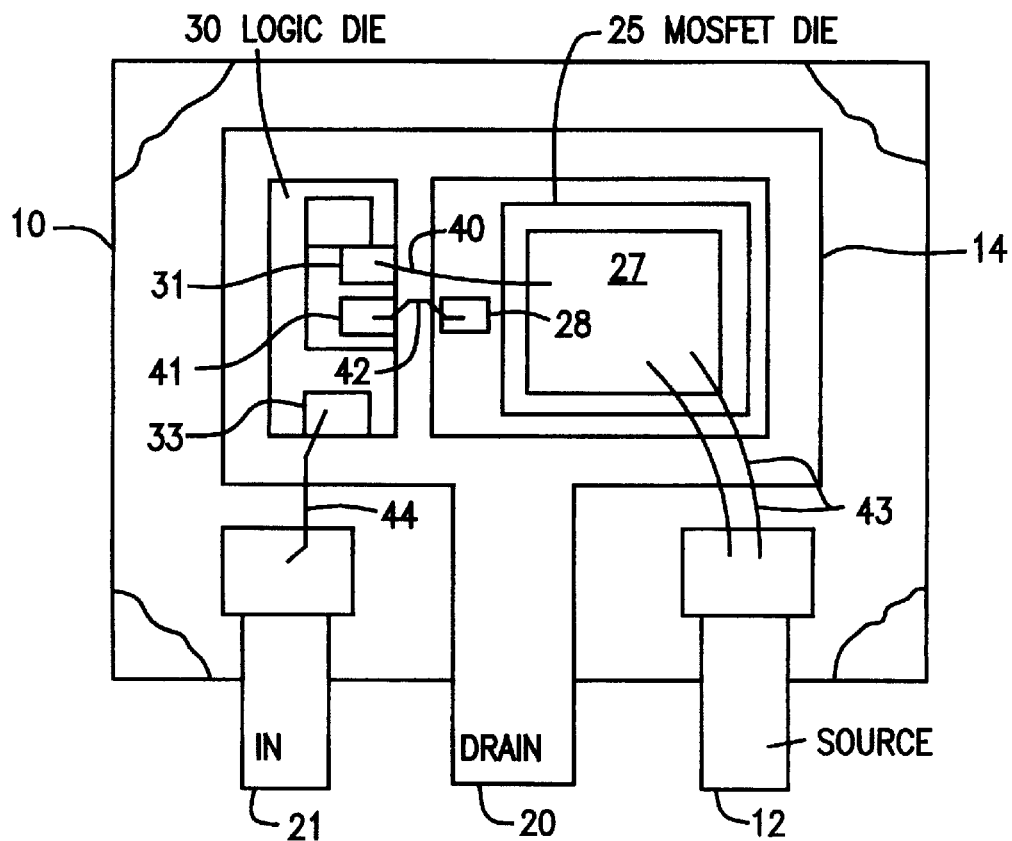
FIG. 2 is a schematic cut-away top view of a lead frame having a power MOSFET die and a logic die fastened thereto in accordance with an embodiment of the invention and which can be housed in the package of FIG. 1.
Figure 3:
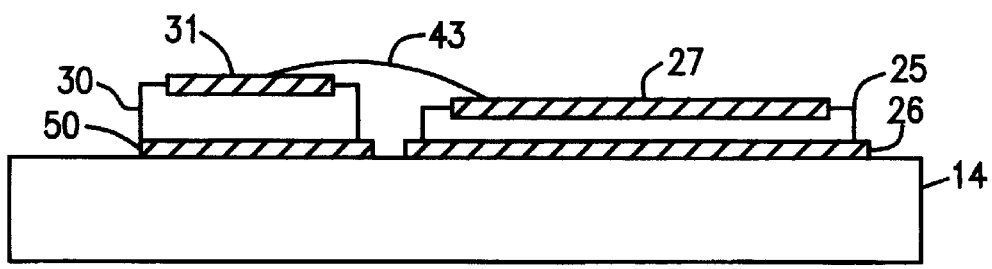
FIG. 3 is a cross-sectional view of the lead frame and two semiconductor die of FIG. 2.

FIGS. 2 and 3 show a power MOSFET die 20 and a logic and protective circuit die 40 internally mounted on a common bonding pad area of a lead frame 52.

Referring next to FIGS. 2 and 3, there are shown, in schematic fashions, a lead frame having the lead frame paddle 14 within the insulation housing 10. The paddle 14 has an integral output drain lead 20, the source lead 12 and input control lead 21, all of which penetrate the insulation housing 10 to be accessible for connection in a 3 pin geometry. A power MOSFET die 25 is fixed to the pad 14 as by soldering.

MOSFET die 25 is a standard vertical conduction discrete power MOSFET die such as the die shown in U.S. Pat. No. 5,008,725. Its bottom drain electrode is soldered or otherwise electrically and thermally connected to pad 14 by solder layer 26 (FIG. 3). Die 25 can be any other type of MOSGATED device, manufactured in a process with a reduced number of masks, as compared to the number of mask steps needed to manufacture a die with logic circuit elements. Typically, die 25 can have a width of 170 mil and a length of 185 mil, and can be about 250 microns thick with an on resistance of 10 milliohms and a blocking voltage of about 50 volts. Die 25 also has a top source electrode 27 and a gate electrode 28.

In the past, thermal sensing logical circuit have been integrated into die 25 for temperature measurement purposes. This however substantially complicates the manufacture of the main power die 25, requiring many additional manufacturing steps and increases its cost.

In accordance with one aspect of the invention, a much smaller auxiliary MOSFET or logic die 30 (sometimes termed a FET or logic MOSFET) is connected in parallel with main FET 25 and contains the necessary integrated temperature monitoring circuitry and other control circuitry needed to measure temperature and perform responsive control of the main MOSFET 25. The logic die 30 has a much smaller area (less than one-half) than the main die 25. It contains a bottom drain electrode which is glued to conductive pad 14 as by a conductive epoxy cement, and a main source electrode 31. Die 30 can have an area of 35 mils by 100 mils and a thickness of about 400 microns. The power section of die 30 may employ the same geometry as that of main die 25. However, logic die will have a logic region 33 integrated therein as will be later described with FIGS. 4, 5 and 6.

The source 27 of MOSFET 25 is connected to the source 31 of logic die on FET 30 by a gold Kelvin bond wire 40 and the gate electrode 41 of die 30 is connected to gate 28 of MOSFET 25 by gold bond wire 42.

Aluminum bond wires 43 connect source 27 to source lead 12 and the input lead 21 is connected to the input to the integrated circuit 33 in die 25 by bond wire 44.

Thus, it will be seen that the main MOSFET 25 and logic MOSFET 30 are connected in parallel and that the gate 28 of MOSFET 25 is controlled in response to the output of the integrated circuit 33.

Thus, in accordance with a first feature of the invention, the temperature measurement process can be carried out in the smaller logic MOSFET 30 which heats roughly proportionally to the parallel connected main MOSFET 25 so that the main MOSFET 25 can be turned off when a target temperature is measured.

It has been found that the logic MOSFET 30 will heat to only about 80% of the temperature of the main layer MOSFET 25 dependant, in part of the processes used to make the MOSFETs. Thus, the quantity of the product of $R_{DSON}$×die area for any MOSFET is dependent on its manufacturing process. The quantity $R_{DSON}$×area for the process used to make MOSFET die 25 (for example, the process described in U.S. Pat. No. 5,795,793 is 100 mΩmm² while that for process used to make the logic MOSFET 30 (the SIV process) is 200 mΩmm². Thus:

$$\frac{R_{DSON} \times \text{Area for Die 30}}{R_{DSON} \times \text{Area for Die 25}} \approx 2$$

In accordance with a further feature of the invention, the measured temperature on die 30 at the location of IC 33 (hereinafter the temperature $T_{SENSE}$) is adjusted such that the temperature at the copper tab 14 (hereinafter $T_{TAB}$) is related to the temperature of the top of the main MOSFET 25 (hereinafter $T_{SENSE}$) by the relation:

$$T_{FET} \approx 2.2(T_{SENSE}-T_{TAB})+T_{TAB}$$

The term "2.2" is a technology factor in which the above derived ratio of 2 is increased to adjust for the measured reduction by 80% of the logic die compared to the main die. This difference is believed due to the difference in lateral temperature gradient in the two die.

Figure 4:
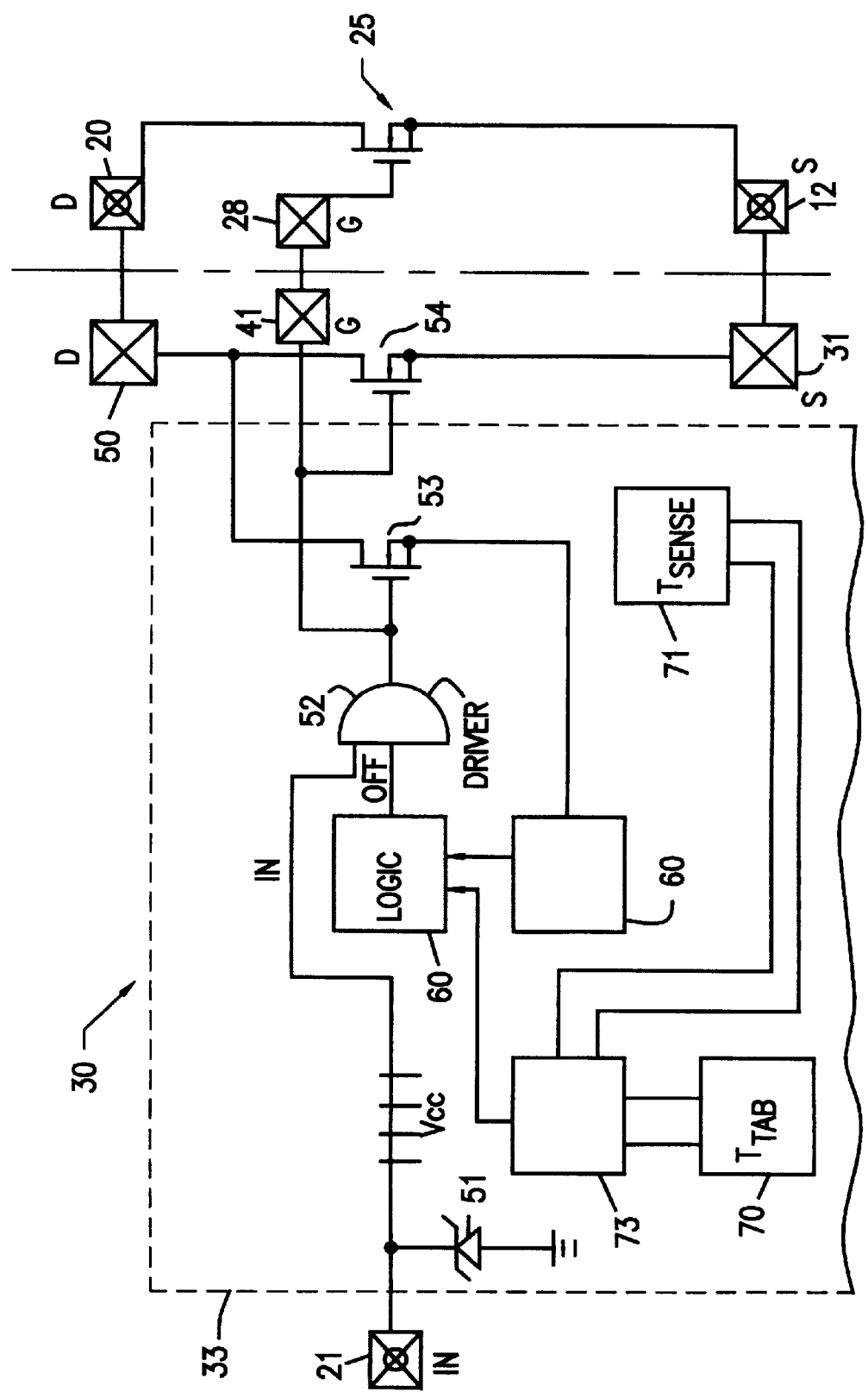
FIG. 4 is a schematic diagram showing the circuitry contained in the die of FIGS. 2 and 3.

FIG. 4 is a circuit diagram of the two MOSFETs 25 and 30, with the integrated circuit 33 of MOSFET 30 shown in the dotted line block 33. The main power MOSFET die 25 has the external terminals 12 and 20, shown in FIG. 2 and gate electrode 28. The drain electrode 50 of MOSFET 30 is connected, through substrate 14 in FIG. 3, to the drain 20 of MOSFET 25; and source 31 of logic MOSFET 30 is connected to source 12 of MOSFET 25. The gate electrodes 28 and 41 are also connected together.

The input signal to control terminal 21 is connected to one terminal of driver 52 and is protected by Zener diode 51. The output of driver 52 is connected to gate terminal 41 and to the gates of current sense cells 53 which are in a current mirror circuit with the main body of the device cells 54. The output $V_{SENSE}$ is then coupled to a current comparator 60 which produces an output to integrated logic circuit 61 which will deliver an "off" signal to driver 52 if the measured current exceeds some predetermined value, thus shutting off the MOSFETs 25 and 30.

Figure 6:
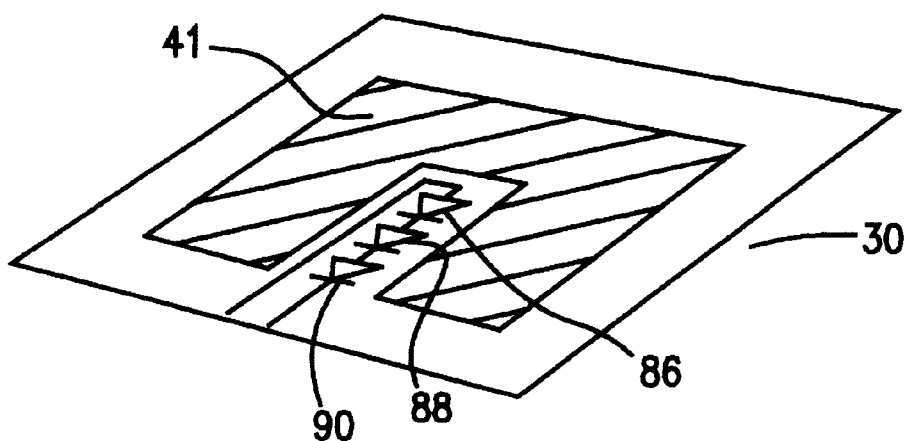
FIG. 6 is a perspective view showing a typical arrangement of the temperature sensing polysilicon diodes of FIG. 5 within the MOSFET of the logic die.

The temperature sensor circuit, which acts as a form of "temperature mirror" has two temperature sources; $T_{TAB}$ 70, which is the temperature of pad 14, and $T_{SENSE}$ 71, which is the temperature of the top of MOSFET die 30. This temperature can be measured as by polysilicon diodes which are shown in FIG. 6. These two temperature signals are applied to integrated circuit 73 which performs the calculation of $T_{FET}$ (of MOSFET 25) from the relation previously described of:

$$T_{FET} \approx 2.2(T_{SENSE} - T_{TAB}) + T_{TAB}$$

This measured value is then compared to a given trigger temperature, for example 150° C. and produces an output to logic circuit 65 in that condition, thus turning off both MOSFETs 25 and 30.

Figure 5:
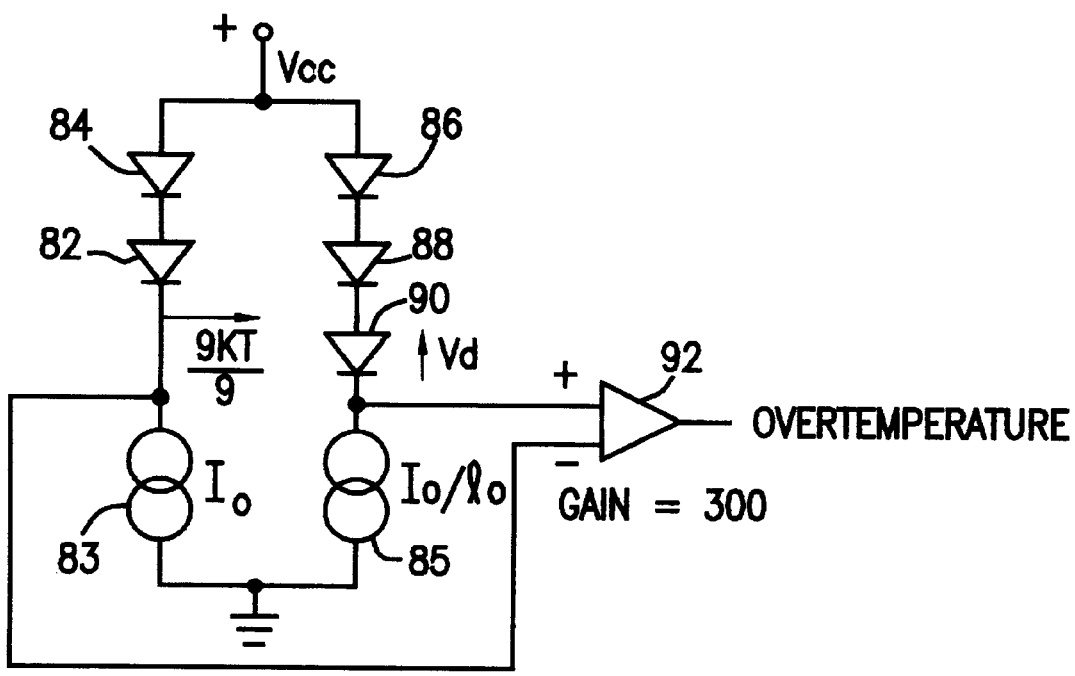
FIG. 5 is a circuit diagram showing a polysilicon diode implementation for the temperature sensors of the logic die of FIG. 2.

FIG. 5 shows a temperature sensor circuit for producing the over temperature signal from circuit 73. Thus, in FIG. 5, diodes 82 and 84 are polysilicon diodes located remotely or far from MOSFET 30 and on the tab 14. These diodes are connected in series with current source 83. Their forward voltage drop is related to the tab temperature.

Diodes 86, 88 and 90 are also polysilicon diodes atop the surface of region 41 of MOSFET 30 and insulated therefrom (FIG. 6) and are connected in series with current source 85. The output of each string is connected to the terminals of operational amplifier 92, the output of which is related to the temperature difference ($T_{SENSE} - T_{TAB}$). This is then further processed in circuit 73 to complete the calculation of $T_{FET}$.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of determining the temperature of a first semiconductor device arranged in a device package comprised of a conductive lead frame having a main pad area; said method comprising the steps of:

arranging, on said main pad area, a first semiconductor die having opposing surfaces which contain respective electrodes such that one of said opposing surfaces of said first semiconductor die is disposed atop and is in electrical and thermal contact with said main pad area, said first semiconductor die comprising said first semiconductor device; and arranging, on said main pad area, a second semiconductor die having opposing surfaces at least one of which contains at least one electrode such that one of said opposing surfaces of said second semiconductor die is disposed atop and is in thermal contact with said main pad area and is spaced from said first semiconductor die; said second semiconductor die comprising a second semiconductor device having a thermal response corresponding to that of said first semiconductor device, a first thermal sensor arranged on said second die at least adjacent to said second semiconductor device, and a second thermal sensor arranged on said second die distant from said second MOS gated semiconductor device;

electrically connecting the opposite ones of said opposing surfaces of said first and second die to each other such that said first and second semiconductor devices are connected in parallel;

determining, using said first thermal sensor, a first temperature value representing the temperature of said second MOS gated semiconductor device;

determining, using said second thermal sensor, a second temperature value representing the temperature of said main pad area; and determining the temperature of said first MOS gated semiconductor device from said first and second temperature values.

2. The method of claim 1 wherein said semiconductor devices are MOS gated semiconductor devices.

3. The method of claim 1 wherein said first MOS gated semiconductor device is a first MOSFET having a source electrode and a gate electrode disposed in said opposite one of said opposing surfaces, and wherein the surface of said first die that is in contact with said main pad area is said drain electrode.

4. The method of claim 3 wherein said second MOS gated semiconductor device is a second MOSFET having a source electrode, a drain electrode and a gate electrode; at least said source and said gate electrodes being disposed in said opposite one of said opposing surfaces; said source electrode of said second MOSFET being connected to said source electrode of said first MOSFET and said gate electrode of said second MOSFET being connected to said gate electrode of said first MOSFET.

5. The method of claim 1 wherein first and second thermal sensors are each comprised of a respective plurality of series connected polysilicon diodes.

6. The method of claim 5 wherein said first and second temperature values are each determined by the addition of respective values determined by each of said plurality of series connected diodes.

7. The method of claim 1 wherein the power dissipated by said second MOS gated semiconductor device is less than that of said first MOS gated semiconductor device.

8. The method of claim 1 wherein the power dissipated by said second MOS gated semiconductor device is approximately one-half that of said first MOS gated semiconductor device.

9. The method of claim 1 wherein said temperature of said first MOS gated semiconductor device is further determined by the ratio of the power dissipated by said second MOS gated device and the power dissipated by said first MOS gated device.

\* \* \* \* \*

UNITED STATES PATENT AND TRADEMARK OFFICE
CERTIFICATE OF CORRECTION

PATENT NO. : 6,300,146 B1
DATED : December 11, 2001
INVENTOR(S) : Mark Blitshteyn et al.

It is certified that error appears in the above-identified patent and that said Letters Patent is hereby corrected as shown below:

<u>Title page, Item [54] and Column 1, lines 1-3,</u>
Change the title to read as follows:
-- IONIZING BAR AND METHOD OF ITS FABRICATION --.

Signed and Sealed this

Fifteenth Day of April, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,300,146 B1
DATED : October 9, 2001
INVENTOR(S) : Vincent Thierry

It is certified that error appears in the above-identified patent and that said Letters Patent is hereby corrected as shown below:

This certificate supersedes Certificate of Correction issued April 15, 2003, the number was erroneously mentioned and should be vacated since no Certificate of Correction was granted.

Signed and Sealed this

Sixth Day of May, 2003

JAMES E. ROGAN
*Director of the United States Patent and Trademark Office*